US011421364B2

(12) United States Patent
Schiestl et al.

(10) Patent No.: US 11,421,364 B2
(45) Date of Patent: Aug. 23, 2022

(54) DEVICE AND METHOD FOR PRODUCING A GARMENT

(71) Applicant: Aeoon Technologies GmbH, Kramsach (AT)

(72) Inventors: Angelo Schiestl, Langkampfen (AT); Justin Choi, Philadelphia, PA (US)

(73) Assignee: Angelo Schiestl, Langkampfen (AT)

( * ) Notice: Subject to any disclaimer, the term of this patent is extended or adjusted under 35 U.S.C. 154(b) by 65 days.

(21) Appl. No.: 15/046,770

(22) Filed: Feb. 18, 2016

(65) Prior Publication Data

US 2016/0244900 A1 Aug. 25, 2016

(30) Foreign Application Priority Data

Feb. 23, 2015 (EP) ..................................... 15156067

(51) Int. Cl.
| | |
|---|---|
| *A41H 3/00* | (2006.01) |
| *D05B 19/12* | (2006.01) |
| *A41H 3/08* | (2006.01) |
| *A41H 42/00* | (2006.01) |
| *G06F 30/00* | (2020.01) |

(Continued)

(52) U.S. Cl.
CPC .............. *D05B 19/12* (2013.01); *A41H 3/007* (2013.01); *A41H 3/08* (2013.01); *A41H 42/00* (2013.01); *B26D 5/005* (2013.01); *G06F 3/1257* (2013.01); *G06F 30/00* (2020.01)

(58) Field of Classification Search
CPC ........ D05B 19/12; B26D 5/005; A41H 3/007; A41H 42/00

USPC .................................................. 700/130–133
See application file for complete search history.

(56) References Cited

U.S. PATENT DOCUMENTS

| | | | |
|---|---|---|---|
| 4,408,291 A | 10/1983 | Gunzberg et al. | |
| 5,230,764 A | 7/1993 | Moll | |

(Continued)

FOREIGN PATENT DOCUMENTS

| | | |
|---|---|---|
| DE | 3544251 A1 | 6/1987 |
| DE | 10223375 | 4/2004 |

(Continued)

OTHER PUBLICATIONS

European Office Action issued in EP Patent Application No. 15 156 067.9, dated Sep. 4, 2018, 4 pages.

(Continued)

*Primary Examiner* — Nathan E Durham
(74) *Attorney, Agent, or Firm* — Dinsmore & Shohl LLP

(57) ABSTRACT

The invention relates to a device and a method for producing a garment which is formed from a plurality of part pieces. For this, a part textile supply means, having at least one textile web, a printing means, a feed means, a programmable control unit, by means of which the printing means can be controlled to print the textile web, wherein at least one part piece is printed, a cutting means, by means of which the at least one textile web can be cut to the part pieces, and at least one sewing station, through which the part pieces can be joined to the garment, are provided. A detection means is arranged which detects the part pieces of a garment and a sorting device is provided which brings together the part pieces of a garment and feeds them to the at least one sewing station.

15 Claims, 1 Drawing Sheet

(51) Int. Cl.
*B26D 5/00* (2006.01)
*G06F 3/12* (2006.01)

(56) References Cited

U.S. PATENT DOCUMENTS

| | | | | |
|---|---|---|---|---|
| 6,173,211 B1* | 1/2001 | Williams | | A41H 3/08 |
| | | | | 700/131 |
| 6,672,187 B2* | 1/2004 | Alsten | | B26D 5/00 |
| | | | | 347/157 |
| 7,140,283 B2* | 11/2006 | Alsten | | B26D 5/00 |
| | | | | 347/157 |
| 7,191,145 B1* | 3/2007 | Lunetta | | G06Q 30/02 |
| | | | | 382/284 |
| 7,359,760 B2* | 4/2008 | Kishi | | D05B 19/04 |
| | | | | 112/475.19 |
| 8,731,703 B1* | 5/2014 | Lehrer | | G06F 3/1257 |
| | | | | 700/132 |
| 9,542,069 B2* | 1/2017 | Mulligan | | G06F 3/04815 |
| 2004/0172325 A1* | 9/2004 | Blanco | | G06Q 30/02 |
| | | | | 705/14.4 |
| 2005/0131571 A1* | 6/2005 | Costin | | G06Q 30/0601 |
| | | | | 700/132 |
| 2005/0177453 A1* | 8/2005 | Anton | | G06Q 10/087 |
| | | | | 705/26.41 |
| 2005/0240416 A1* | 10/2005 | Schindler | | G06Q 10/06 |
| | | | | 700/131 |
| 2005/0289018 A1* | 12/2005 | Sullivan | | G06Q 30/00 |
| | | | | 705/26.5 |
| 2006/0015207 A1* | 1/2006 | Weiser | | G06Q 30/02 |
| | | | | 700/132 |
| 2006/0031392 A1* | 2/2006 | Lunetta | | G06T 11/60 |
| | | | | 709/217 |
| 2006/0167581 A1* | 7/2006 | Kawaguchi | | D05B 19/10 |
| | | | | 700/138 |
| 2008/0228312 A1* | 9/2008 | Dickerson | | D05B 19/04 |
| | | | | 700/132 |
| 2008/0249652 A1* | 10/2008 | Burr | | A41H 3/007 |
| | | | | 700/132 |
| 2009/0043417 A1* | 2/2009 | Yamada | | D05B 19/12 |
| | | | | 700/138 |
| 2013/0144424 A1* | 6/2013 | Jarbouai | | G06F 9/06 |
| | | | | 700/134 |
| 2014/0277663 A1 | 9/2014 | Gupta et al. | | |
| 2014/0277683 A1* | 9/2014 | Gupta | | G06F 17/50 |
| | | | | 700/132 |

FOREIGN PATENT DOCUMENTS

| | | |
|---|---|---|
| IE | 950483 A1 | 12/1996 |
| WO | 2000070976 | 11/2000 |
| WO | 2003099052 | 12/2003 |

OTHER PUBLICATIONS

Foreign Associate correspondence regarding Prior Art cited in corresponding EP Application No. 15 156 067.9, mailed May 15, 2018, 1 page.

* cited by examiner

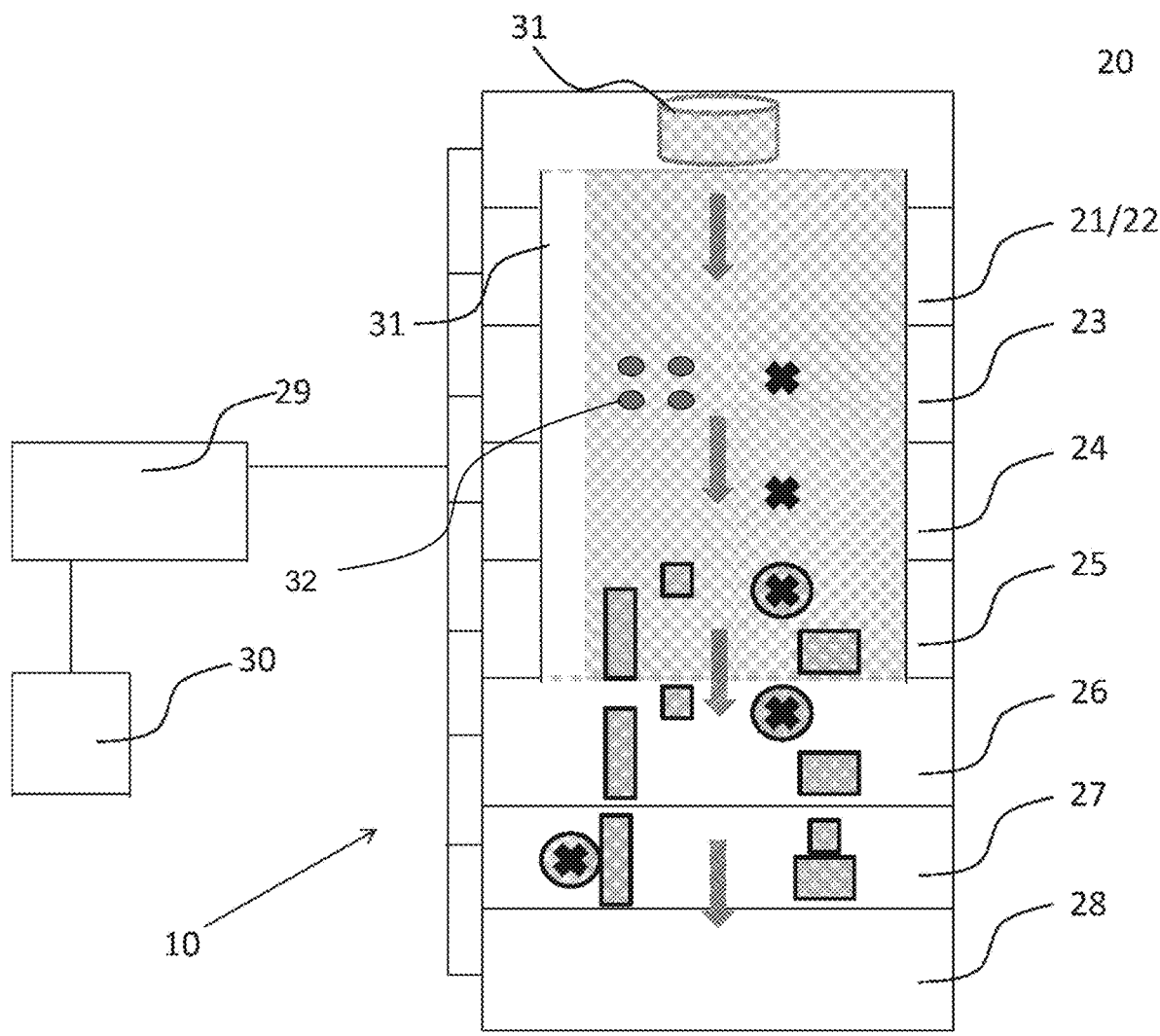

DEVICE AND METHOD FOR PRODUCING A GARMENT

BACKGROUND

The invention relates to a device for producing a garment which is formed from a plurality of part pieces according to the preamble to claim 1.

A generic device and a corresponding method for producing a garment from a textile web which is formed from a plurality of part pieces is known for example from DE 102 23 375 A1. In this device and the corresponding method a material stock is provided, which is printed by a printer and processed by a cutting device to material parts, wherein the material parts are then sewn together to form a garment.

SUMMARY

Embodiments have a textile supply means, having at least one textile web, a printing means, by means of which the at least one textile web can be printed, a feed means, through which the at least one textile web can be fed to the printing means, a programmable control unit, by means of which the printing means can be controlled to print the textile web, wherein at least one part piece is printed, a cutting means, by means of which the at least one textile web can be cut into the part pieces, and at least one sewing station, through which the part pieces can be joined together to form the garment.

The invention further relates to a method for producing a garment which is formed from a plurality of part pieces according to the preamble to claim 8.

In such a method at least one textile web from a textile supply means is fed through a feed means to a printing means, the at least one textile web is printed by the printing means, the printing means is controlled by a programmable control unit to print the textile web, the printed textile web is cut by a cutting means into part pieces and the part pieces of a garment are joined in at least one sewing station.

In particular having regard to the economical use of a textile web in the production of a plurality of garments in series or a plurality of individual orders, it can be necessary for individual part pieces of a garment to be provided on the textile web not in direct proximity to each other. This results in part pieces which belong to one and the same garment being arranged on the textile web relative to each other in an unclear way, which means that an allocation of the part pieces to a garment is associated with considerable resources.

It is the object of the invention to indicate a device for producing a garment which is formed from a plurality of part pieces and also a corresponding production method which allow individual part pieces to be cut out of a garment to be arranged on a textile web also at a greater spatial distance from each other and still to allow an efficient and secure allocation of the individual part pieces to a common garment.

The object is achieved according to the invention on the one hand by a device having the features of claim 1 and on the other hand by a method having the features according to claim 8. Advantageous embodiments are indicated in the dependent claims, the description and the figures.

The device according to the invention for producing a garment which is formed from a plurality of part pieces is characterised in that a detection means is arranged between the cutting means and the at least one sewing station, which detection means detects the part pieces of a garment, and that a sorting device is provided which is connected to the detection means and brings together the part pieces of a garment and feeds them to the at least one sewing station.

Furthermore the method according to the invention for producing a garment which is formed from a plurality of part pieces is characterised in that a detection means detects the part pieces of a garment and that a sorting device which is connected to the detection means brings together the detected part pieces of a garment and feeds them to the at least one sewing station.

BRIEF DESCRIPTION OF THE DRAWINGS

FIG. 1 shows a schematic illustration of the device according to the invention for producing a garment.

DETAILED DESCRIPTION

A core idea of the invention is that individual part pieces of a garment which are cut from a textile web are identified and brought together so that the subsequent joining of the part pieces to form the garment is simplified. The bringing-together can be realised in such a way that the individual part pieces are arranged partially or completely spatially relative to each other as is provided for the finished garment. Optionally the individual part pieces of the garment can be brought together by the sorting device as is advantageous for the subsequent joining of the part pieces to form the garment in the sewing station. It can hereby be particularly advantageous that the part pieces are arranged in direct proximity to each other. The subsequent joining of the part pieces brought together in a sewing station can be achieved by a device or by workforce. In this way, not only stitching, but additionally or alternatively welding or other joining, of the part pieces to form the garment can be realised in the sewing station.

Both in the case of a manual and also an automatic joining the bringing-together of the part pieces of a garment in the above-described way can lead to a simplification of the production process, a considerable time-saving and thus to more economical production of the garment during the joining process in the sewing station. The detection means for detecting the part pieces of a garment can preferably be designed with an optical sensor means so that it detects the respective part piece using specific features such as cut, position of the part piece on the textile web, imprint or at least one marking.

The detection means preferably has suitable means for detecting the respective part piece, in particular sensors, particularly preferably at least one camera and/or a laser scanner. The sorting means can have controllable adjustment members such as switches, flaps, grippers or air jets, through which a position or movement direction of the textile part can be changed in the desired manner. An endless conveyor, in particular a conveyor belt, can be provided in the device for transport.

According to a further development of the invention it is preferable that the printing means comprises at least one digital printing head, wherein the at least one textile web can be printed by the at least one digital printing head with digital printing ink. Digital printing technology has proven itself particularly in textile printing. The printing means comprises in particular a plurality of injection nozzles, with which the desired inks and designs can be efficiently applied. Prior to printing, a pre-treatment of the textile can be carried out. In particular a pre-treatment liquid can be applied which prevents the printing ink from running.

It is further preferred that a marking means is provided, through which each part piece of a garment can be provided with a marking, and that the marking is designed to indicate the garment to which the part pieces belong. The marking means can be formed as part of the printing means, wherein the marking can be applied in the form of a print on the respective part piece. The marking of the respective part piece can also be applied when the textile part piece is otherwise unprinted. Any other form of marking of the individual part piece is also conceivable that allows automatic detection according to common methods. This can be applicable labels, which have in particular optically, magnetically, inductively or electronically readable markings. Advantageously the marking can also be characterised in that it is applied to the part piece colourlessly or in the colour of the base colour of the textile web or the design, wherein the information can be read magnetically, inductively or electronically. In principle the print image of the respective part piece, if any, can also act as a marking. A printed marking can be preferably a bar-code or a QR code.

The marking can be designed so that it contains all essential information relating to the allocation of the marked part piece to a garment and/or to an order for example in coded form. Alternatively the marking can also be designed so that it contains a reference to the information for an allocation of the part piece to a garment and/or to an order. The actual information relating to the garment and/or the respective order can hereby be contained as an entry in a database of the programmable control unit. The programmable control unit can read the markings by means of suitable means, for example sensors, and control the device correspondingly according to orders. An order is understood to be the relevant data provided by a user concerning the number of the garments to be produced, size, base colour, print thereof and similar which are required to produce the garment according to the order.

It is particularly useful according to a further development of the invention that the marking can be provided on the textile web already before the cutting of the part pieces. Accordingly not only the cut part piece itself, but instead already the textile web can be provided with corresponding markings which indicate an allocation of the part piece to be created to a garment and/or an order. The marking is preferably applied after the provision of a base colour insofar as such a base colour is provided. In other cases the marking can also be provided before, during or after the printing of the part piece with the corresponding print image.

The marking is preferably arranged in a seam region which is no longer visible on the finished garment. According to a further development of the invention it is particularly advantageous that the part pieces have at least one textile area which comprises the marking, wherein the textile area lies outside of the cutting pattern of the garment. The textile area which comprises the marking can be understood to be an extension of the actual part piece, thus as a type of washing label-type extension which can be cut out integrally therewith from the textile web by the cutting means. The textile area which comprises the marking preferably has a perforation which facilitates the removal of the textile area from the part piece after completion of the garment in a simple way.

A preferred further development of the invention can be seen in that the programmable control unit is designed to receive image data sent by a client and to apply a corresponding print image for a part piece of a garment in a provided print area by means of the printing means. The client can transmit the image and order data, jointly with other data of one order to produce a garment, optionally directly on site to the device via an input unit with input means, for example a user terminal, or via a remote data communication means, for example by a computer with corresponding software via the internet. The programmable control unit can select, based on the image and order data sent by the user, a print area for the respective part piece on the at least one textile web and activate the printing means to print the textile web with a corresponding print image. The programmable control unit can hereby adapt the relative orientation of individual print areas of different part pieces to each other on the textile web according to aspects that save consumption material.

A useful further development of the invention can be seen in that the textile web is provided with a base colour and that the printing means is designed to apply a new base colour over the area. In order to guarantee the usability of a textile web for as many different print orders as possible, it can be advantageous to provide the textile web with a uniform colour, preferably as light a colour as possible, in particular a white textile web. The textile web particularly preferably has a colour which facilitates an undercoat of greatest coverage with a base colour. Should according to the order a different base colour of the textile be desired, this can be changed for example by means of the printing means and applied over the area. The printing means for this purpose is preferably designed so that it contains at least one undercoat printing head, by means of which the textile can be printed with the base colour.

According to an advantageous further development of the method according to the invention the textile web is provided with a marking, wherein the marking stands for a previously clearly defined order to create a garment. The order can hereby have, as previously described, all the information required for the production of the garment. Particularly preferably the marking can indicate the allocation of a part piece to a specific garment from an order comprising a plurality of garments.

It is further preferred according to a further development of the invention that the programmable control unit detects by means of a sensor means the at least one marking on the textile web, determines its position on the textile web and transmits this information to the cutting means, and the cutting means, based on the transmitted information, cuts out part pieces of the previously clearly defined order from the textile web. The sensor means can be formed as an integral constituent part of the cutting means. The programmable control unit can be connected to the sensor means and receive and evaluate the sensor data. If the marking is an optical symbol the sensor means can be designed for example as a camera. In the case of other types, for example electronic or magnetic markings, the sensor means can be correspondingly supplemented and/or adapted to facilitate reading-out of the marking. If the marking is provided on the part piece created only after cutting of the part piece, the programmable control unit can control the printing, cutting and marking means also directly and in relation to each other, so that the marking does not yet have to be provided at the time of the cut, in order to guarantee a cut that is suitable for the print area and the order. The cutting can be carried out by means of a laser. A surface treatment of the textile with the laser can also be realised, for example a roughening, perforation or the formation of particular colour effects.

It is particularly preferred according to a further development of the invention that the at least one textile area of the part piece which has the at least one marking is separated after the completion of the garment. For this, the textile area comprising the marking can be designed so that it can be separated in a particularly simple way from the finished garment.

FIG. 1 shows a device 10 for producing a garment which is formed from a plurality of part pieces. The device 10 comprises a programmable control means 29 which controls the working mode of the individual means of the device for producing a garment which is formed from a plurality of part pieces. An coordinated interplay of the means can thus be facilitated. Through an input unit 30, which is optionally directly connected to the programmable control unit 29, or via a remote communication means, for example the internet which can be selected via a computer with suitable software, the programmable control means 29 can be programmed by a user with an order to produce a garment.

The device 10 comprises in a first area a textile supply means 20, which in particular provides a textile roll or a different continuously formed textile source as a textile web 31. In a continuous process the textile web 31 is guided through the individual means of the device to produce a garment.

With the aid of a feed means 21 the textile web 31 is fed in a first step to the printing means 23, by means of which the textile web can be printed. The printing means 23 may comprise at least one digital printing head comprising at least a plurality of injection nozzles 32 for applying different ink. The printing means 23 comprises a marking means 22, by means of which in a predefined print area a marking for a part piece of a garment can be applied on the textile web 31. In dependence upon the garment to be produced, optionally firstly a base colour is applied by at least one foundation means of the printing means 23 on the textile web 31. Subsequently the marking and the print image for a part piece of a garment are provided in a print area on the textile web 31.

In a further area of the device, after printing of the textile web 31, the marking applied on the textile web 31 and/or the print image of the part piece of the garment can be detected by a sensor means 24 and processed by means of the programmable control unit 29 connected to the sensor means 24. The programmable control unit 29 can hereby request the order data saved by the user and thus assign an imprint and/or marking on the textile web to a cutting pattern to be used.

The obtained information for the orientation and position of the part piece of the garment to be cut out and the corresponding cutting pattern are transmitted by the programmable control means 29 to the cutting means 25. The cutting means 25 cuts, according to the instructions of the programmable control unit 29, the part piece of the garment to be created from the textile web 31. The control unit 29 facilitates an adapted relative orientation of the individual part pieces to be cut out also of different garments on the textile web 31 so that an extensively low-waste or waste-free cutting of the part pieces from the textile web 31 is realised by the programmable control unit 29.

The cutting means 25 can be a conventional cutting means with cutting blades. However, it is also conceivable to realise the cutting of the part piece from the textile web through physical or thermal separation processes common to the person skilled in the art. For example the cutting means can also be designed with at least one laser which separates the textile webs at the provided points.

The respective cut part piece is subsequently fed to a detection means 26 which detects the garment to which the part piece belongs. Subsequently a sorting means 27 brings together detected part pieces of the garment. The programmable control unit 29 is connected to the detection means 26 and the sorting means 27. Through the programmable control unit 29 the sorting means 27 receives the necessary instructions to bring together the individual part pieces of a garment. This can be realised for example via slider elements or compressed air nozzles. The programmable control unit 29 can detect by means of the detection means 26 the allocation of individual part pieces to a garment on the one hand by reference to the cutting pattern, the imprint and the marking of a part piece.

The programmable control unit 29 can also bring together, through the sorting means 27, part pieces of a plurality of identical garments to form units which respectively only hold parts for one garment.

The part pieces brought together of a garment are further fed on a conveyor belt to the sewing stations 28. The sewing stations 28 join the part pieces brought together to the finished garment. The feeding of the part pieces of the garment brought together to the sewing stations 28 can optionally be carried out manually or by a conveying means. A plurality of sewing stations 28 can thus be provided and supplied with part pieces of a garment brought together.

The invention claimed is:

1. A device for producing a garment which is formed from a plurality of part pieces, having:
   a textile supply means, having at least one textile web,
   a printing means, by means of which the at least one textile web can be printed,
   a feed means, through which the at least one textile web can be fed to the printing means,
   a programmable control unit, by means of which the printing means can be controlled to print the textile web, wherein at least one part piece is printed, and the programmable control unit is designed to receive image and order data sent by a client and to apply a corresponding print image, on the textile web in a provided print area, for a part piece of a garment by means of the printing means,
   a cutting means, by means of which the at least one textile web can be cut to form the part pieces,
   a plurality of sewing stations, through which the part pieces can be joined to form the garment, and
   at least one digital printing head comprising a plurality of injection nozzles for applying different inks to the textile web,
   wherein:
   a marking means by which each part piece of the garment is provided with a marking and the marking is designed to indicate the garment to which the part pieces belong,
   a detection means is arranged between the cutting means and the at least one sewing station, which detection means detects the part pieces of a garment and is integrally formed as a constituent part of the cutting means,
   the programmable control unit detects, by the detection means, the at least one marking on the textile web, determines a position of the at least one marking on the textile web, and transmits information regarding the at least one marking and the position of the at least one marking on the textile web to the cutting means,
   the programmable control unit facilitates an adapted relative orientation of the individual part pieces on the textile web based on the at least one marking,
   the cutting means, based on the transmitted information, cuts from the textile web part pieces of a garment, a sorting device is provided which is connected to the detection means and brings together the part pieces of a plurality of garments into a plurality of sorted units and feeds the plurality of sorted units to the plurality of sewing stations, and each of the plurality of sorted units respectively only holds part pieces for one garment.

2. The device according to claim 1, wherein a marking can be provided on the textile web before separating the individual part pieces.

3. The device according to claim 1, wherein the part pieces have at least one textile area which comprises a marking, wherein the textile area lies outside of the cutting pattern of the garment.

4. The device according to claim 1, wherein the textile web is provided with a base colour and the printing means is designed to apply a new base colour over an area of the textile web.

5. The device according to claim 1, wherein individual sorted units of the plurality of sorted units are conveyed to individual sewing stations of the plurality of sewing stations.

6. The device according to claim 1, wherein the plurality of garments are identical garments.

7. A method for producing a garment which is formed from a plurality of part pieces, the method comprising:
feeding, using a feed means, at least one textile web from a textile supply means to a printing means,
printing, using the printing means, the at least one textile web, wherein the printing means is at least one digital printing head comprising at least a plurality of injection nozzles for applying different inks,
marking, using a marking means, each part piece of the garment wherein the marking indicates the garment to which the part pieces belong,
controlling, using a programmable control unit, the printing means to print the textile web, wherein the programmable control unit is designed to receive image and order data sent by a client and to apply a corresponding print image, on the textile web in a provided print area, for a part piece of a garment by means of the printing means,
cutting, using a cutting means, the printed textile web into part pieces, and
joining, using a plurality of sewing stations, the part pieces to a garment, wherein:
a detection means that is integrally formed as a constituent part of the cutting means detects the part pieces of a garment,
a sorting device which is connected to the detection means brings together the detected part pieces of a plurality of garments into a plurality of sorted units and feeds the plurality of sorted units to the plurality of sewing stations,
the programmable control unit detects, by the detection means, the at least one marking on the textile web, determines the position of the at least one marking on the textile web, and transmits information regarding the at least one marking and the position of the at least one marking on the textile web to the cutting means,
the programmable control unit facilitates an adapted relative orientation of the individual part pieces on the textile web based on the at least one marking,
the cutting means cuts from the textile web part pieces of a garment based on the transmitted information, and
each of the plurality of sorted units respectively only holds part pieces for one garment.

8. The method according to claim 7, wherein the textile web is provided with a marking, wherein the marking stands for a previously clearly defined order to create a garment.

9. The method according to claim 7, wherein a textile area of the part piece which has the at least one marking is separated from the completed garment after completion of the garment.

10. The method according to claim 7, wherein the digital printing means can be used as a marking means for printing a marking.

11. The method according to claim 7, wherein the at least one textile web is pre-treated with a pre-treatment liquid.

12. The method according to claim 7, wherein individual sorted units of the plurality of sorted units are conveyed to individual sewing stations of the plurality of sewing stations.

13. The method according to claim 7, wherein the plurality of garments are identical garments.

14. A device for producing a garment which is formed from a plurality of part pieces, having
a textile supply means, having at least one textile web,
a printing means, by means of which the at least one textile web can be printed,
a feed means, through which the at least one textile web can be fed to the printing means,
a marking means by which each part piece of the garment is provided with a marking and the marking is designed to indicate the garment to which the part pieces belong,
a programmable control unit, by means of which the printing means can be controlled to print the textile web, wherein at least one part piece is printed, and the programmable control unit is designed to receive image and order data sent by a client and to apply a corresponding print image, on the textile web in a provided print area, for a part piece of a garment by means of the printing means,
a cutting means, by means of which the at least one textile web can be cut to form the part pieces,
a plurality of sewing stations, through which the part pieces can be joined to form the garment, and
at least one digital printing head comprising a plurality of injection nozzles for applying different inks to the textile web,
wherein:
a detection means is arranged between the cutting means and the at least one sewing station, which detection means detects the part pieces of a garment and is integrally formed as a constituent part of the cutting means,
the programmable control unit detects, by the detection means, the at least one marking on the textile web, determines the position of the at least one marking on the textile web, and transmits information regarding the at least one marking and the position of the at least one marking on the textile web to the cutting means,
the programmable control unit facilitates an adapted relative orientation of the individual part pieces on the textile web based on the at least one marking on the textile web,
the cutting means, based on the transmitted information, cuts from the textile web part pieces of a garment, and
a sorting device is provided which is connected to the detection means and allocates at least one of the plurality of part pieces to a specific garment from an order comprising a plurality of garments and brings together the at least one of the plurality of part pieces with the specific garment into a sorted unit which only holds part pieces for one garment and feeds the sorted unit to at least one of the plurality of sewing stations.

15. The device according to claim 1, wherein the programmable control unit is further configured to select, based on the image and order data sent by the client, the print area on the at least one textile web.

\* \* \* \* \*